US 6,602,305 B2

(12) United States Patent
Kawada

(10) Patent No.: US 6,602,305 B2
(45) Date of Patent: Aug. 5, 2003

(54) CARRIER REEL, CARRIAGE METHOD USING THE CARRIER REEL, AND METHOD FOR MANUFACTURING ELECTRONIC DEVICE

(75) Inventor: Seiichi Kawada, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/084,173

(22) Filed: Feb. 28, 2002

(65) Prior Publication Data

US 2002/0082337 A1 Jun. 27, 2002

Related U.S. Application Data

(62) Division of application No. 09/717,082, filed on Nov. 22, 2000, now Pat. No. 6,451,623.

(30) Foreign Application Priority Data

Sep. 22, 2000 (JP) ........................................ 2000-288450

(51) Int. Cl.[7] ........................... H01L 21/00; H01L 21/64
(52) U.S. Cl. ............................................................ 29/25.01
(58) Field of Search ............................................ 29/25.01

(56) References Cited

U.S. PATENT DOCUMENTS 5,524,850 A * 6/1996 Liao ............................ 241/117

* cited by examiner

Primary Examiner—David E. Graybill
(74) Attorney, Agent, or Firm—Rabin & Berdo, P.C.

(57) ABSTRACT

A carrier reel according to the present invention is constituted by a flange portion having a first surface and a second surface which is opposed to and substantially parallel to the first surface, and a hub portion which is provided between the first surface and the second surface and to which the flange portion is connected. A bearing portion at which a shaft used for taking out each electronic component after carriage is supported is provide to the hub portion, and spaces for accommodating therein a drying agent, i.e., drying agent accommodating portions are formed at the part of the hub portion except the bearing portion. The drying agent is accommodated in the drying agent accommodating portions. The carrier reel having the drying agent accommodated therein is put in a damp proof bag to be sealed. The sealed damp proof bag is then packaged to be carried. As a result, it is possible to provide the carrier reel by which the cubic volume of the entire package becomes constant irrespective of characteristics of electronic components to be carried and provide a carriage method using such a carrier reel.

46 Claims, 4 Drawing Sheets

CARRIER REEL, CARRIAGE METHOD USING THE CARRIER REEL, AND METHOD FOR MANUFACTURING ELECTRONIC DEVICE

This application is a divisional of Ser. No. 09/717,082, filed Nov. 22, 2000, U.S. Pat. No. 6,451,623.

BACKGROUND OF THE INVENTION (i) Field of the Invention

The present invention relates to a carrier reel used for carrying a plurality of products, electronic components of, e.g., a semiconductor apparatus in particular, and to a carriage method using the carrier reel.

(ii) Description of the Prior Art

In case of carrying electronic components of, e.g., a semiconductor apparatus, there is adopted a carriage method by which a carrier tape which is a tape accommodating a plurality of electronic components therein are wound around the carrier reel and the carrier reel is fed to carry a plurality of electronic components.

The carrier reel used in this method has such a structure as that a flange portion consisting of two surfaces which is distanced from each other by a tape width and provided in parallel with and opposed to each other is connected to a hub portion provided between the two surfaces.

In the carriage method for electronic components adopting such a carriage method, after carriage, an axial rod is inserted into a through hole and the like provided in the center of a body portion of the real to mount the carrier reel having the carrier tape wound around the reel on an automatic assembling line, and the individual electronic components are supplied by drawing the carrier tape, thereby performing mounting and assembling of each electronic component.

SUMMARY OF THE INVENTION

It is, therefore, an object of the present invention to provide a carrier reel for carrying a plurality of electronic components, by which the volume of the entire package becomes constant irrespective of characteristics of the electronic components to be carried and to provide a carriage method using the carrier reel.

To achieve this aim, the present invention provides a carrier reel comprising: a flange portion having a first surface and a second surface which is opposed to and substantially parallel to the first surface; and a hub portion which is provided between the first surface and the second surface and connected to the flange portion, a carrier tape in which a plurality of electronic components are mounted being wound around the hub portion, accommodation portions accommodated a drying agent being provided to the hub portion.

In addition, the present invention provides a carriage method using the carrier reel comprising: winding a carrier tape in which a plurality of electronic components are mounted around a hub portion of a carrier reel which comprises a flange portion having a first surface and a second surface which is opposed to and substantially parallel to the first surface and a hub portion which is provided between the first surface and the second surface and is connected to the flange portion, the hub portion having accommodation portions accommodated a drying agent provided thereto; accommodating the drying agent in the accommodation portions; and putting the carrier reel around which the carrier tape is wound into a bag, sealing the bag and performing carriage after accommodating the drying agent in the accommodation portions.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments according to the present invention will now be described with reference to the accompanying drawings.

Figure 1:
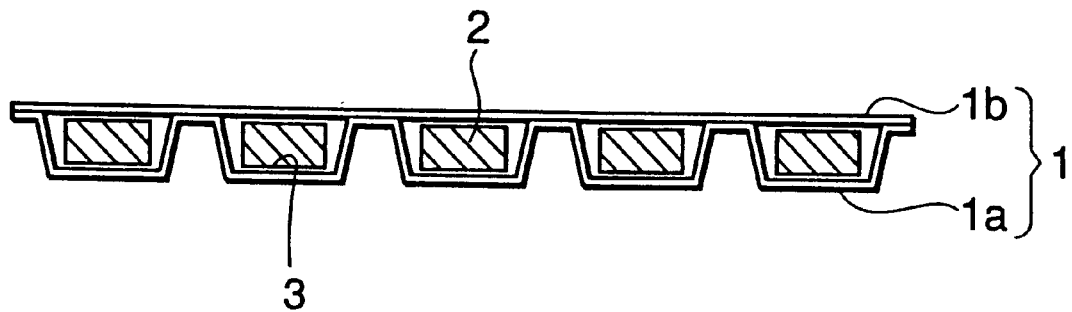
FIG. 1 is a cross-sectional view showing a carrier tape in a first embodiment according to the present invention.
Figure 2:
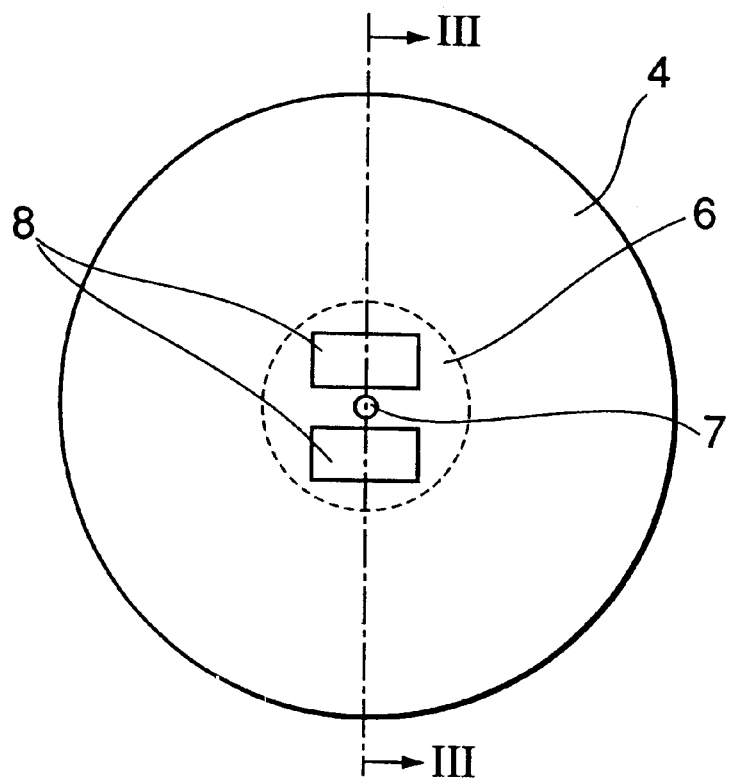
FIG. 2 is a plane view of a carrier reel in the first embodiment according to the present invention.
Figure 3:
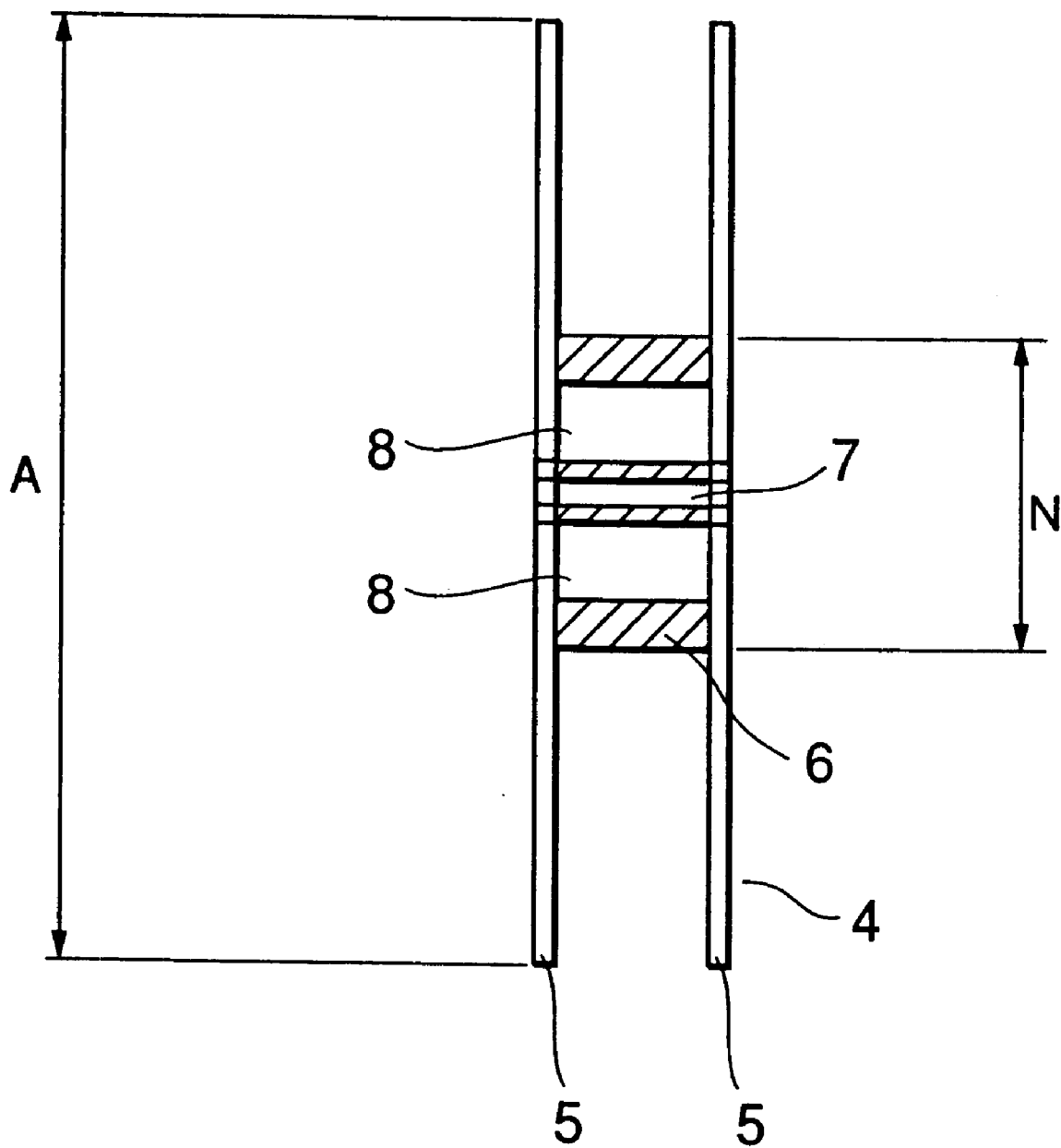
FIG. 3 is a perspective view of the carrier reel in the first embodiment according to the present invention, taken along the line III—III in the plane view.

FIGS. 1 to 3 are views showing a first embodiment according to the present invention. FIG. 1 is a cross-sectional view of a carrier tape wound around a carrier reel of this embodiment; FIG. 2, a plane view of the carrier reel; and FIG. 3, a cross-sectional view taken along the III—III line in FIG. 2.

Description will first be given as to the carrier tape wound around the carrier reel in this embodiment.

As shown in FIG. 1, a carrier tape 1 in which electronic components are accommodated is constituted by a carrier tape main body 1a and a cover tape 1b. Embossed pockets 3 which are concave portions are provided to the carrier tape main body 1a at predetermined intervals in the lengthwise direction. A chip type electronic component such as a capacitor or an LSI mounted on a printed board is accommodated in each embossed pocket 3. Particularly, in FIG. 1, a resin sealed type semiconductor device 2 which is easily affected by humidity during carriage, e.g., a semiconductor device sealed by epoxy-based mold resin is accommodated. Further, the cover tape 1b prevents an electronic component accommodated in the embossed pocket 3 from coming off.

FIGS. 2 and 3 are views showing a carrier reel in the first embodiment.

As shown in FIGS. 2 and 3, the carrier reel in this embodiment is constituted by a pair of flat plate portions which is a flange portion 5 having a first surface and a second surface which is opposed to and substantially parallel to the first surface, and a drum portion which is a hub portion 6 to which the flange portion 5 is connected. A bearing portion 7 as a through hole which is supported by an axial rod of the automatic assembling line is formed in the center of the hub portion 6. To the bearing portion 7 is fixed the axial rod of the automatic assembling line provided in a direction vertical to the flange portion 5 consisting of the two surfaces after carriage of the reel. In this manner, the carrier reel of this embodiment is mounted on the automatic assembling line. In addition, drying agent accommodation portions 8 for accommodating the drying agent are provided to the hub portion 6 except the bearing portion 7. The carrier reel of this embodiment may be constituted by individual parts such as the flange portion or the hub portion or may be integrally molded.

Specifically, in this embodiment using the reel 4 having a reel external diameter A of 330 mm and a hub diameter N of 100 mm, the rectangular drying agent accommodation portion 8 having the cross section of 25 mm×50 mm is provided.

In the present invention, however, the cross section of the drying agent accommodating portion 8 does not need to have a rectangular shape, and it may have a sector form. Additionally, the present invention is characterized in that a large hollow portion of the hub portion 6 except the bearing portion 7 is utilized to provide the drying agent accommodating portion 8 for accommodating the drying agent. An opening portion is, therefore, provided to the flange portion and the entire hub portion 6 except the bearing portion 7 may be used as the drying agent accommodating portion.

Further, if moisture must be further assuredly prevented from entering, it is desirable to increase an amount of the drying agent accommodated in the drying agent accommodating portions 8 as much as possible. In other words, it is desirable that a maximum amount of the drying agent which can be accommodated is housed in the drying agent accommodating portions 8. Specifically, approximately 60 g of a clay-based drying agent is accommodated as the drying agent in the drying agent accommodating portions 8 in this embodiment. However, an amount of the drying agent to be accommodated is not limited to 60 g, and accommodating at least approximately 20 g of the drying agent can sufficiently prevent moisture from entering during carriage.

Since the carrier tape 1 accommodating therein a plurality of electronic components is wound in the later step, the diameter of the hub portion 6 usually takes such a value as that each accommodated electronic component can not be damaged. As a result, the diameter of the hub portion 6 is larger than the diameter of the baring portion 7 which supports a shaft for packaging each electronic component, and a large hollow portion exists in the area of the hub portion 6 except the bearing portion 7.

In this embodiment, the drying agent accommodating portions 8 are provided by utilizing the hollow portion of the hub portion 6. Therefore, assuring only a cubic volume of the carrier reel suffices carriage of each electronic component which requires the drying agent during carriage, and the excessive volume for putting the drying agent is not necessary. Consequently, even in carriage of each electronic component which can be easily affected by moisture, an amount of the entered moisture can be reduced, and the carrier reel which does not have to increase the cubic volume of the entire package can be provided.

Further, in the first embodiment, as shown in FIG. 2, the drying agent accommodating portions 8 are so provided as to utilize the hollow portion of the hub portion 6 to the fullest extent. In this embodiment, therefore, a sufficient amount of the drying agent can be accommodated.

Additionally, in the first embodiment, the drying agent accommodating portions 8 are provided at positions symmetrical to the bearing portion 7. By arranging the drying agent accommodating portions 8 at positions symmetrical to the shaft portion 6, the weight balance relative to the axial rod becomes equable when the axial rod is inserted into the bearing portion 7 to mount the carrier reel on the automatic assembling line. As a result, the electronic component can be smoothly supplied. Even in the case where each electronic component is mounted or assembled after carriage by using the carrier reel, the assembling process of an electronic product can be consequently facilitated with the drying agent being accommodated. That is, in the present embodiment, the step and time for removing the drying agent from the drying agent accommodating portions 8 are not required.

It is to be noted that the shape of the drying agent accommodating portion 8 corresponds to the through hole in this embodiment but provision of a space in which the drying agent can be accommodated can suffice the present invention, and it does not have to be the through hole. Moreover, in the bearing portion 7, although this embodiment employs the through hole, the through hole does not have to be used. Mounting the reel to the automatic assembling line in the assembling step which is a post-process can suffice the present invention.

Further, in this embodiment, the carrier reel constituted by the flange portion 5 and the hub portion 6 is formed of, e.g., polystyrene or a recycling material having the same quality. If the conductivity is required in the carrier reel 4, however, forming the carrier reel 4 by using polystyrene in which a carbon material is mixed as a conductivity giving agent can impart the conductivity to the carrier reel itself.

As described above, according to the present embodiment, providing the drying agent accommodating portions 8 to the hub portion 6 of the carrier reel 4 which carries a plurality of electronic components enables accommodation of the drying agent by exploiting the inside or the carrier reel 4, i.e., the hollow portion of the hub portion 6. Therefore, when carrying each electronic component which can be easily affected by moisture, the excessive cubic volume of the drying agent which has been conventionally required is no longer necessary.

In other words, using the carrier reel according to this embodiment requires not excessive cubic volume of the drying agent. Thus, when carrying each electronic component which can be easily affected by moisture and requires the drying agent, the same number of the electronic components can be carried in a space which is substantially the same as that in the case of carrying electronic components requiring no drying agent. Furthermore, since the volume of the package used for carriage becomes equal irrespective of packaging environment conditions for the electronic component to be carried, the package having the same size can be used.

Figure 4:
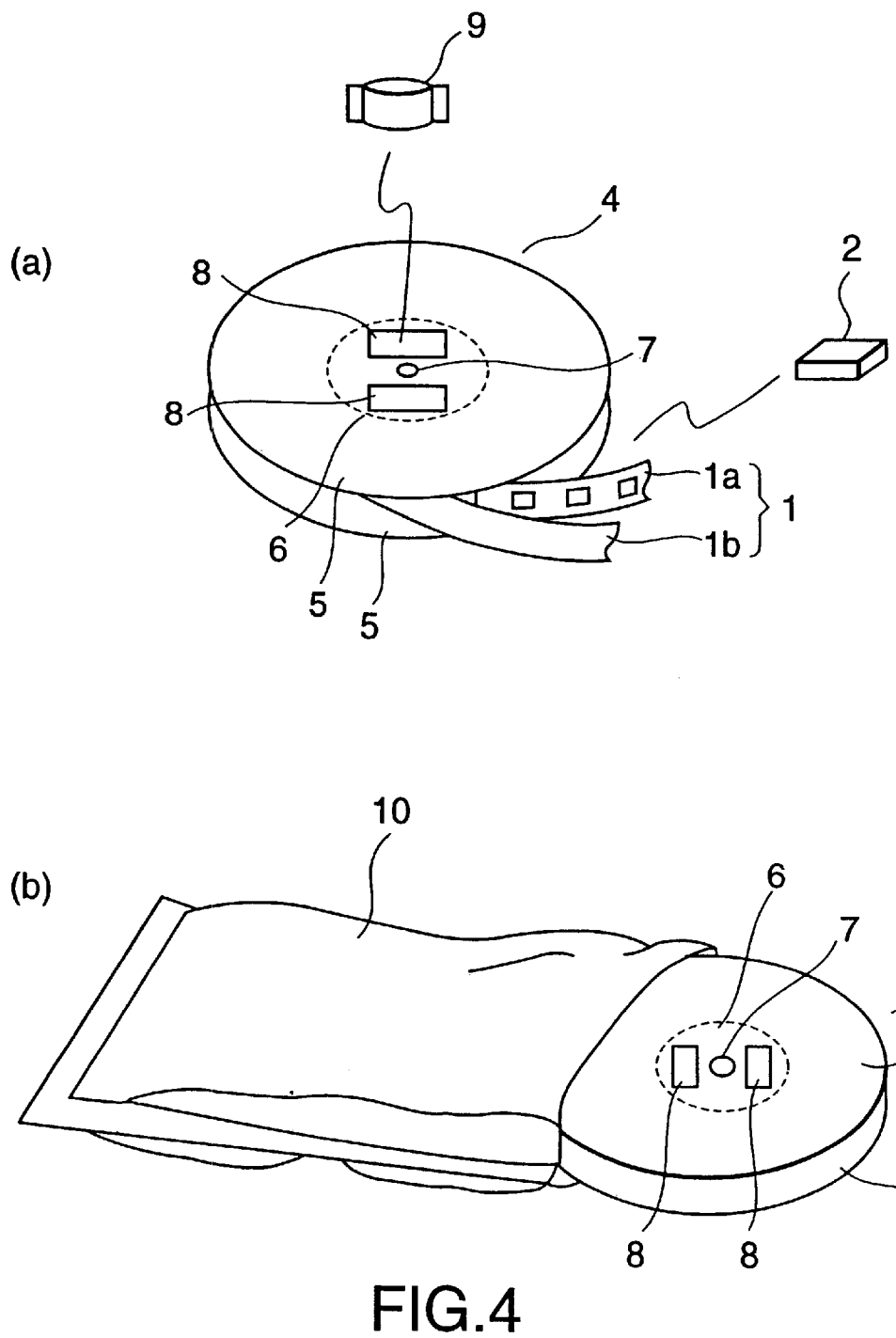
FIG. 4 is an inclined plane view showing a carriage method using the carrier reel in a second embodiment according to the present invention.

A second embodiment according to the present invention will now be described with reference to the accompanying drawings. FIGS. 4(a) and 4(b) are views of respective steps showing a carriage method using the carrier reel in the second embodiment according to the present invention.

A reel 4 having spaces portion for accommodating therein the drying agent such as described in connection with the first embodiment, i.e., drying agent accommodating portions 8 is first prepared. Subsequently, a carrier tape 1 which has been also described in conjunction with the first embodiment and is shown in FIG. 1 is wound around a hub portion 6 of the reel 4, and a plurality of electronic components are accommodated in the reel 4. As shown in FIG. 4(a), a drying agent 9 having a necessary amount is accommodated in each drying agent accommodating portion 8 of the reel 4.

Here, the specific dimension of each part and an amount of the drying agent to be accommodated are as described in the first embodiment.

As shown in FIG. 4(b), the drying agent 9 and the electronic component are put in a damp proof bag 10 together with the reel 4 accommodating them, and the damp proof bag 10 is sealed. Thereafter, the sealed damp proof bag 10 is put into a packaging material such as an inner box previously made of a paperboard so that packaging is performed. Further, these inner boxes are grouped and packaged by an outer box which is similarly made of a paperboard.

A plurality of electronic components are finally carried in the state that they are packaged by these outer boxes.

Figure 5:
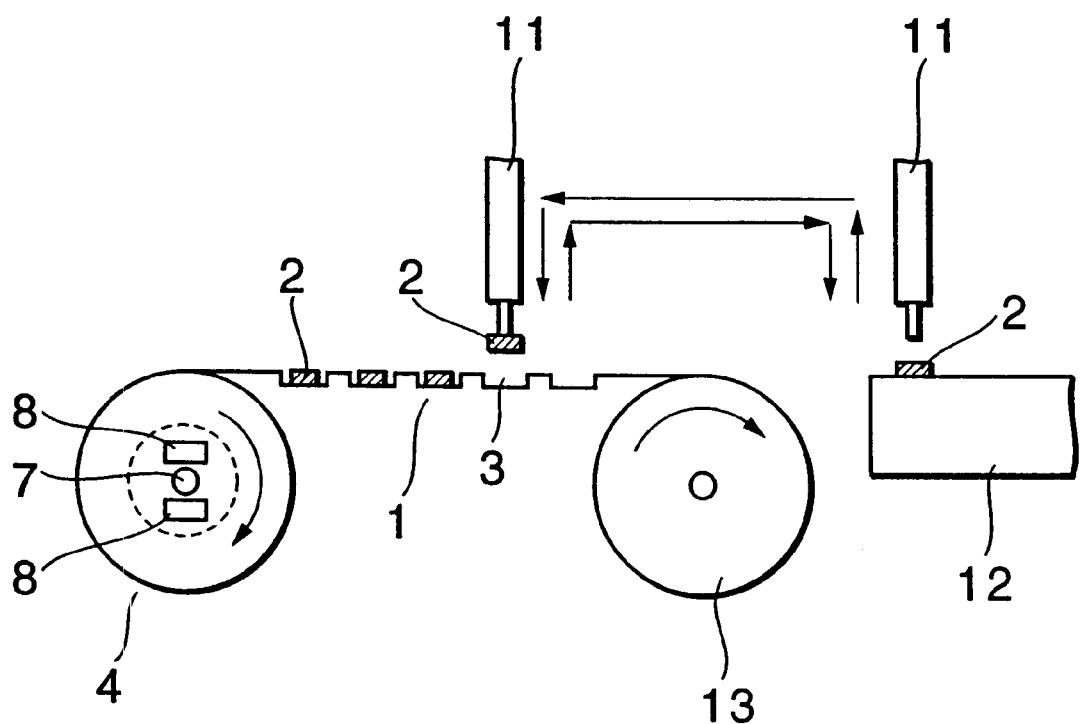
FIG. 5 is a schematic view showing a packaging method for electronic components using the carrier reel in the second embodiment according to the present invention.

After carrying the electronic components in this manner, as shown in FIG. 5, the carrier reel is mounted on the automatic assembling line with the carrier tape being wound around the carrier reel. At this time, the end of the carrier tape 1 is wound around a take-up reel 13. Subsequently, each electronic component accommodated in the carrier tape, for example, a chip type electronic component such as a capacitor or an LSI is supplied to a printed board 12 and the like by a tool 11 by which drawing and vacuum absorption of the carrier tape are performed. After supply of each electronic component to the printed board, for example, solder reflow is conducted so that mounting of each electronic component on the printed board and assembling of an electronic product are executed.

In particular, if a semiconductor device sealed by resin is mounted in the carrier tape to be carried, using the carriage method of this embodiment can avoid such a problem as that, after carriage of the semiconductor device, the heat treatment such as solder reflow performed for mounting each semiconductor device on a board can prevent sudden cubical expansion of moisture entered in the package of the semiconductor device during carriage and generation of peeling or a crack on the package boundary face.

Furthermore, according to such a carriage method in the second embodiment, since the excessive cubic volume of the drying agent is not necessary, it is possible to carry the reels whose number is equal to that of the reels used for carrying electronic components requiring no drying agent. As a result, even in case of carrying electronic components which can be readily affected by moisture, a number of reels capable of carrying these components in a limited space can be increased. That is, a larger number of electronic components can be carried at the same time.

When the reel in which the drying agent accommodating portions 8 for accommodating therein the drying agent are provided at positions symmetrical to the bearing portion 7 is used, the weight balance relative to the shaft becomes equable in the assembling process for an electronic product using the automatic assembling line, and the post-process can be hence carried out without requiring the process for removing the drying agent. As a result, the electronic component can be assembled with the reduced labor and time.

It is to be noted that the above has described the carriage method by which the carrier tape is wound around the reel 4 and the drying agent 9 is then accommodated in each drying agent accommodating portion 8 in this embodiment.

In the present embodiment, there is used the carriage method by which the carrier tape is wound around the reel 4 and the drying agent 9 is then accommodated because the drying capability of the drying agent is improved as the time that the drying agent is open to the outside air is shorter. In order to educe the drying capability of the drying agent to the fullest extent, it is desirable that the drying agent 9 is accommodated in each drying agent accommodating portion 8 after winding the carrier tape around the reel 4 and the reel 4 is immediately put in the damp proof bag 10 to be sealed.

In the present invention, however, the carriage method by which the drying agent 9 is accommodated in the reel 4 and the carrier tape is then wound around the reel 4 may be adopted, and the present invention is not restricted to this carriage method.

As described above, when the carrier reel according to the present invention is applied, since the accommodating portions for accommodating the drying agent are provided to the hollow portion of the hub portion, there is no need to provide an excessive space for the drying agent to be included even if electronic components which can be easily affected by moisture are carried. Therefore, the size of this reel can be the same as that of the carrier reel for electronic components which require no drying agent, and packaging materials such as common inner boxes and outer boxes can be utilized.

In addition, in the carriage method using the carrier reel according to the present invention, the space required for carrying one reel can be reduced even in cases where electronic components requiring the drying agent are carried. A plurality of electronic components can be consequently carried in the limited space.

If the reel in which the drying agent accommodating portions 8 for accommodating therein the drying agent are provided at positions symmetrical to the bearing portion 7 is used for carriage, the post-process can be performed without requiring the process for removing the drying agent in the assembling process for an electronic product using the automated assembling line.

What is claimed is:

1. A method for mounting one of a plurality of humidity sensitive electronic components on a printed circuit board, comprising:

preparing a carder reel having a hub portion, a carrier tape and a carrier package;

storing the plurality of electronic components in the carrier tape;

accommodating a desiccant in the hub portion;

winding the carrier tape around the hub portion;

putting the carder reel with the carrier tape into the carrier package;

sealing the carrier package;

carrying the carrier package to an assembling line;

after said carrying the carrier package, removing the carrier reel from the carrier package with the carrier tape;

setting the carrier reel on the assembling line with the carrier tape wound;

supplying at least one of the electronic components onto the printed circuit board; and fixing the at least one of the electronic components on the printed circuit board by solder, wherein the solder is heated.

2. The method according to claim 1, wherein the electronic components are semiconductor devices, which are sealed by epoxy-based mold resin.

3. The method according to claim 1, wherein the plurality of electronic components are supplied onto the printed circuit board with the desiccant accommodated in the hub portion.

4. The method according to claim 1, wherein the carrier reel includes a flange portion having a first surface and a second surface opposed to and substantially parallel to the first surface, the hub portion being provided between the first surface and the second surface and being connected to the flange portion.

5. The method according to claim 1, wherein the desiccant is accommodated in the hub portion after winding the carrier tape around the hub portion.

6. The method according to claim 5, wherein the desiccant is accommodated in the hub portion before putting the carrier reel into the carrier package.

7. The method according to claim 1, wherein the carrier package is moisture-proof so that contents of the carrier package protected from dampness outside the carrier package.

8. The method according to claim 1, wherein an amount of the desiccant is equal to or more than 20 g.

9. The method according to claim 1, wherein the carrier reel has a bearing portion in the hub portion, and the carrier reel is set on the assembling line by leading an axial rod of the assembling line through the bearing portion.

10. The method according to claim 1, wherein the desiccant is accommodated in the hub portion with the desiccant disposed symmetrically relative to the bearing portion.

11. The method according to claim 1, wherein the solder is heated before fixing the electronic components onto the printed circuit board.

12. A method for mounting one of a plurality of humidity-sensitive electronic components on a printed circuit board, comprising:
preparing a carrier reel having a hub portion, a carrier tape and a carrier package;
storing the plurality of electronic components in the carrier tape;
accommodating a desiccant in the hub portion;
winding the carrier tape around the hub portion;
putting the carrier reel with the carrier tape into the carrier package;
sealing the carrier package;
carrying the carrier package to an assembling line;
after said carrying the carrier package, removing the carrier reel from the carrier package with the carrier tape;
setting the carrier reel on the assembling line with the carrier tape wound; and
mounting at least one of the electronic components on the printed circuit board by a heat treatment.

13. The method according to claim 12, wherein the electronic components are semiconductor devices that are sealed by an epoxy-based mold resin.

14. The method according to claim 12, wherein the electronic components are supplied onto the printed circuit board with the desiccant accommodated in the hub portion.

15. The method according to claim 12, wherein the carrier reel includes a flange portion having a first surface and a second surface opposed to and substantially parallel to the first surface, the hub portion being provided between the first surface and the second surface and being connected to the flange portion.

16. The method according to claim 12, wherein the desiccant is accommodated in the hub portion after winding the carrier tape around the hub portion.

17. The method according to claim 16, wherein the desiccant is accommodated in the hub portion before putting the carrier reel into the carrier package.

18. The method according to claim 12, wherein the carrier package is damp-proof so that contents of the carrier package are protected from dampness outside the carrier package.

19. The method according to claim 12, wherein an amount of the desiccant is equal to or more than 20 g.

20. The method according to claim 12, herein the carrier reel has a bearing portion in the hub portion and the carrier reel is set on the assembling line by leading an axial rod of the assembling line through the bearing portion.

21. The method according to claim 12, wherein the desiccant is accommodated in the hub portion with the desiccant disposed symmetrically relative to the bearing portion.

22. The method according to claim 12, wherein the electronic components are mounted on the printed circuit board using molten solder.

23. The method according to claim 1, wherein the at least one of the electronic components is fixed on the printed circuit board in a low humidity atmosphere.

24. The method according to claim 12, wherein the at least one of the electric components is mounted on the printed circuit board in a low humidity atmosphere.

25. A method for mounting one of a plurality of humidity sensitive electronic components on a printed circuit board, comprising:
preparing a carrier reel having a hub portion in which a desiccant is accommodated and a carrier tape in which the plurality of electronic components are stored and which is wound around the hub portion;
preparing a carrier package into which the carrier reel is put with the carrier tape and which is carrier to an assembling line;
after said carrying the carrier package, removing the carrier reel from the carriage package with the carrier tape;
setting the carrier reel on the assembling lime with the carrier tape wound;
supplying at least one of the electronic components onto the printed circuit board: and
fixing the at least one of the electronic components on the printed circuit board by solder, wherein the solder is heated.

26. The method according to claim 25, the electronic components are semiconductor devices, which are sealed by epoxy-based mold resin.

27. The method according to claim 25, wherein the carrier reel includes a flange portion having a first surface and a second surface opposed to and substantially parallel to said first surface, and wherein said preparing a carrier reel includes providing said hub portion between said first surface and said second surface and connected to said flange portion.

28. The method according to claim 25, wherein the desiccant is accommodated in the hub portion after the carrier tape is wound around the hub portion.

29. The method according to claim 28, wherein the desiccant is accommodated in the hub portion before putting the carrier reel is put into the carrier package.

30. The method according to claim 25, wherein the carrier package is damp-proof so that contents of the carrier package are protected from dampness outside the carrier package.

31. The method according to claim 25, wherein the amount of the desiccant accommodated in the hub portion is equal to or more than 20 g.

32. The method according to claim 25, wherein the carrier reel has a bearing portion in the hub portion, and the carrier reel is set on the assembling line by leading an axial rod of the assembling line through the bearing portion.

33. The method according to claim 25, wherein the desiccant is accommodated in the hub portion symmetrically relative to the bearing portion.

34. The method according to claim 25, wherein the solder is heated before fixing the electronic components onto the printed circuit board.

35. The method according to claim 25, wherein the at least one of the electronic components is fixed on the printed circuit board in a low humidity atmosphere.

36. A method for mounting one of a plurality of humidity sensitive electronic components on a printed circuit board, comprising:

preparing a carrier reel having a hub portion in which a desiccant is accommodated and a carrier tape in which the plurality of electronic components are stored, the carrier tape being wound around the hub portion; and preparing a carrier package into which the carrier reel is put with the carrier tape, and carrying the carrier package to an assembling line;

after said carrying the carrier package, removing the carrier reel from the carrier package with the carrier tape;

setting the carrier reel on the assembling line with the carrier tape wound;

supplying at least one of the electronic components onto the printed circuit board: and mounting the at least one of the electronic components on the printed circuit board by a heat treatment.

37. The method according to claim 36, wherein the electronic components are semiconductor devices, which are scaled by epoxy-based mold resin.

38. The method according to claim 36, wherein said preparing the carrier reel includes providing a flange portion having a first surface and a second surface opposed to and substantially parallel to said first surface, and providing the hub portion between said first surface and said second surface, connected to said flange portion.

39. The method according to claim 36, wherein the desiccant is accommodated in the hub portion after the carrier tape is wound around the hub portion.

40. The method according to claim 36, wherein the desiccant is accommodated in the hub portion before the carrier reel is put into the carrier package.

41. The method according to claim 36, wherein the carrier package is moisture-proof so that contents of the carrier package are protected from dampness outside the carrier package.

42. The method according to claim 36, wherein the amount of the desiccant accommodated in the hub portion is equal to or more than 20 g.

43. The method according to claim 36, wherein the carrier reel has a bearing portion in the hub portion, and wherein said setting the carrier reel on the assembling line includes leading an axial rod of the assembling line through the bearing portion.

44. The method according to claim 36, wherein the desiccant is accommodated in the hub portion symmetrically relative to the bearing portion.

45. The method according to claim 36, wherein said mounting the at least one of the electrical components on the printed circuit includes melting solder and then fixing the electronic components onto the printed circuit board therewith.

46. The method according to claim 36, wherein the at least one of the electronic components is mounted on the printed circuit board in a low humidity atmosphere.

* * * * *